United States Patent
Sommer et al.

(10) Patent No.: US 7,372,093 B2
(45) Date of Patent: *May 13, 2008

(54) DRAM MEMORY WITH VERTICALLY ARRANGED SELECTION TRANSISTORS

(75) Inventors: Michael Sommer, Raubling (DE); Gerhard Enders, Olching (DE)

(73) Assignee: Infineon Technologies AG, Munich (DE)

(*) Notice: Subject to any disclaimer, the term of this patent is extended or adjusted under 35 U.S.C. 154(b) by 270 days.

This patent is subject to a terminal disclaimer.

(21) Appl. No.: 10/744,056

(22) Filed: Dec. 23, 2003

(65) Prior Publication Data

US 2005/0056873 A1 Mar. 17, 2005

(30) Foreign Application Priority Data

Dec. 23, 2002 (DE) ................. 102 60 769

(51) Int. Cl.
*H01L 27/108* (2006.01)

(52) U.S. Cl. ........................ 257/301; 257/302

(58) Field of Classification Search ........... 257/301, 257/302

See application file for complete search history.

(56) References Cited

U.S. PATENT DOCUMENTS 5,561,308 A 10/1996 Kamata et al.
6,262,448 B1 7/2001 Enders et al.
6,363,484 B1 3/2002 Cordery et al.
6,406,970 B1 6/2002 Kudelka et al.
6,770,928 B2 * 8/2004 Sommer et al. ............ 257/301
6,876,025 B2 * 4/2005 Sommer et al. ............ 257/296
2004/0197989 A1 * 10/2004 Sommer et al. ............ 438/243

FOREIGN PATENT DOCUMENTS

DE          199 54 867          12/2000

OTHER PUBLICATIONS

Office Action from German Patent and Trademark Office dated Aug. 13, 2003.

* cited by examiner

*Primary Examiner*—Jack Chen
(74) *Attorney, Agent, or Firm*—Patterson & Sheridan, L.L.P.

(57) ABSTRACT

The invention relates to a semiconductor memory, particularly a DRAM, in which the memory cells in each case have a trench capacitor arranged in a lower area of a trench hole and a vertical selection transistor which is formed adjoining an upper area of the trench hole and which connects an inner electrode of the trench capacitor to a bit line, a conductive channel being capable of being formed in dependence on the potential of a word line in the channel area, the channel area completely enclosing the trench hole in its upper area, and the associated word line at least partially enclosing the channel area.

17 Claims, 8 Drawing Sheets

A-A'

DRAM MEMORY WITH VERTICALLY ARRANGED SELECTION TRANSISTORS

CROSS-REFERENCE TO RELATED APPLICATIONS

This application claims foreign priority benefits under 35 U.S.C. §119 to co-pending German patent application number 102 60 769.9-33, filed Dec. 23, 2002. This related patent application is herein incorporated by reference in its entirety.

BACKGROUND OF THE INVENTION

1. Field of the Invention

The invention relates to a memory cell having a vertical selection transistor, to an arrangement of such memory cells and to a method for producing these memory cells.

2. Description of the Related Art

Information can be stored and read out again with the aid of rewritable semiconductor memories. In the case of a DRAM semiconductor memory, the information is stored in the form of a particular charge in a storage capacitor. In this arrangement, each DRAM memory cell comprises one trench capacitor and one selection transistor. In the trench capacitor, a charge is stored which represents the information to be stored. The selection transistor, in contrast, is used as a switch for the writing and reading process. When the selection transistor of the memory cell is activated by means of the associated word line, the stored charge is transferred to a bit line of the semiconductor memory. The voltage of the bit line can be evaluated via an evaluation circuit so that the charge stored in the trench capacitor can be detected as information.

The performance of such memory cells is fundamentally determined both by the characteristics of the individual components themselves and by their interaction.

The continuous trend for memories with higher and higher capacity necessitates increasingly higher integration densities of the semiconductor patterns. To reduce the area required by DRAM memory cells, concepts with a vertically arranged selection transistor are also increasingly examined.

From DE 199 54 867 C1, a DRAM cell arrangement and a method for producing it is known in which a vertical selection transistor is provided. The known cell arrangement has a trench capacitor which is connected to a horizontally arranged source-drain region in the upper end area. A lower source-drain region which is connected to a vertical interconnection channel is formed offset with respect to the upper source-drain region. The interconnection channel is run from the lower source-drain region up to the bit line. In parallel with the interconnection channel, a gate region is formed which represents a part of a word line. The known cell arrangement has the disadvantage that a relatively large amount of area is needed for forming the memory cell.

From U.S. Pat. No. 6 262 448 B1, a generic memory cell, a corresponding arrangement of memory cells and a method for producing it are known.

From U.S. Pat. No. 5 561 308, a memory cell structure having an annular vertical TFT transistor is also known, the one electrode of which forms at the same time the inner capacitor electrode.

SUMMARY OF THE INVENTION

It is, therefore, the object of the invention to provide a memory cell and a method for producing memory cells, where the area required by the memory cell is further reduced and a rapid storage and read-out of digital information is made possible. Furthermore, it is the object of the invention to provide an arrangement of memory cells which permits a high packing density of the memory cells.

The memory cell according to the invention has a trench capacitor which is arranged in the lower area of a trench hole. The trench capacitor comprises an inner electrode and an outer counterelectrode, a dielectric layer being arranged between the inner electrode and outer counterelectrode. The memory cell has a vertical selection transistor via the channel area of which the inner electrode of the trench capacitor can be connected to a bit line. The channel area is conducted through an associated word line to the bit line, it being possible to form a conductive channel in the interior of the channel area in dependence on the potential of the word line.

In the memory cell according to the invention, the essentially vertical channel area is formed along the horizontal cross section of the trench hole and completely encloses the trench hole in its upper area. The channel area has a maximum width due to this embodiment of the memory cell according to the invention. The advantageous factor is that the maximum width also maximizes the cross section of the channel area as a result of which the saturation current of the channel area, i.e., the maximum charge which can be transported per unit of time into the memory cell or out of the memory cell, is increased. This, in turn, provides for faster writing and reading of the memory cell. For this reason, this embodiment of the invention is particularly of advantage for those applications in which it is especially important to have short access times when storing the information.

In the solution according to the invention, the channel area is conducted through the associated word line in such a manner that the channel area is wholly or partially enclosed by the word line. This geometry makes it possible for the channel area to be used as a source-drain path of the vertical selection transistor. In distinction from conventional field-effect transistors, the source-drain area is in this case enclosed on all sides by the word line acting as gate electrode. The potential of the associated word line is used for forming a conductive channel in the channel area. The channel area can be changed into the conductive state by activation of the word line and then connects the inner electrode of the trench capacitor to the associated bit line. The solution according to the invention, to conduct the channel area through the associated word line to the bit line, represents the easily produced embodiment of a vertical selection transistor. Because of the circumferentially arranged gate electrode, the "surrounded-gate transistor" according to the invention has an increased current yield in the channel area so that the speed of writing and reading the memory cell can be increased further.

In two advantageous embodiments of the invention, the trench hole and the channel area essentially have rectangular or rounded cross sections. As a result, regular arrangements of memory cells can be implemented in a particularly good manner. Due to the high degree of regularity of such an arrangement, the trench capacity can be additionally increased by "bottling" (wet-chemical post-etching). Furthermore, a square or circular cross sectional area Q permits optimum utilization of the chip area, achieving a minimum cell size of 4 $F^2$.

In a further advantageous development of the invention, a gate oxide layer is arranged between the semiconductor block and the associated word line wholly or at least partially enclosing the semiconductor block. The advantageous factor is that as a result, a "surrounded-gate transistor" can be formed in which the semiconductor block is enclosed on all sides by the word line acting as gate electrode. The memory cell can be rapidly written to and read out via the conductive channel which can be generated in this manner.

The arrangement according to the invention comprises a multiplicity of memory cells M of the type described above. It is of advantage if the trench holes are arranged in a regular arrangement of rows and columns. Such a regular arrangement can be produced in a simple process. It is also possible with such a regular structure to additionally increase the capacity of the trench holes by a step of so-called "bottling" (wet-chemical post-etching). The higher capacity provides for secure storage of the information to be stored. The bit lines can also be formed as unfolded bit lines, an external potential in each case being used as reference potential for the read-out process. In this embodiment of the invention, it is irrelevant if channel areas of adjacent bit lines are also activated by the word line because each bit line is read out separately.

As an alternative, it is of advantage if the trench holes are arranged offset with respect to one another seen in the direction of the bit line. This, too, results in a structure which is easily produced, in which the capacity of the trench holes can be additionally increased by a step of so-called "bottling" (wet-chemical post-etching). In this arrangement, the bit lines can be formed as folded bit lines, the potential of an adjacent bit line in each case being used as reference potential for the read-out process. It is of advantage that no external reference potential needs to be provided and, as a result, the structure of the array of memory cells is simplified. It is a further advantage that the bit lines do not need to be initialized with an external reference potential but only short-circuited for a short time before the read-out. This accelerates the read-out process.

It is of advantage if the word lines are implemented as buried word lines which are arranged within recesses etched into the silicon substrate. Compared with word lines applied to the silicon substrate, buried word lines have the advantage that the insulation with respect to the trench holes located underneath, with respect to the adjacent word lines and with respect to the bit lines arranged above can be structured in a very simple manner. A covering oxide layer is used as insulation with respect to the trench holes, isolating trenches filled with insulating material are used as insulation with respect to adjacent word lines and an insulating covering layer is also used as insulation with respect to the bit lines arranged above the word lines. A further advantage is that buried word lines have a large cross section and, as such, also good conductivity because the entire word line plane can be used for producing the word lines. Due to the high conductivity of such word lines, the selection transistors can be rapidly activated.

In a further advantageous development of the invention, adjacent word lines are insulated from one another by isolating trenches. The width of the isolating trenches directly determines the width of the word lines. The advantageous factor is in this case, in particular, that by producing especially narrow isolating trenches, e.g., with the aid of spacer technology, the word line width, and thus the conductivity of the word lines, can be maximized. Furthermore, a covering oxide layer introduced into the recesses can be used as etch stop during the production of the isolating trenches which simplifies the production of word lines isolated from one another.

BRIEF DESCRIPTION OF THE DRAWINGS

In the text which follows, the invention will be explained in greater detail by means of drawings, in which.

DETAILED DESCRIPTION OF THE PREFERRED EMBODIMENT

Figure 1:
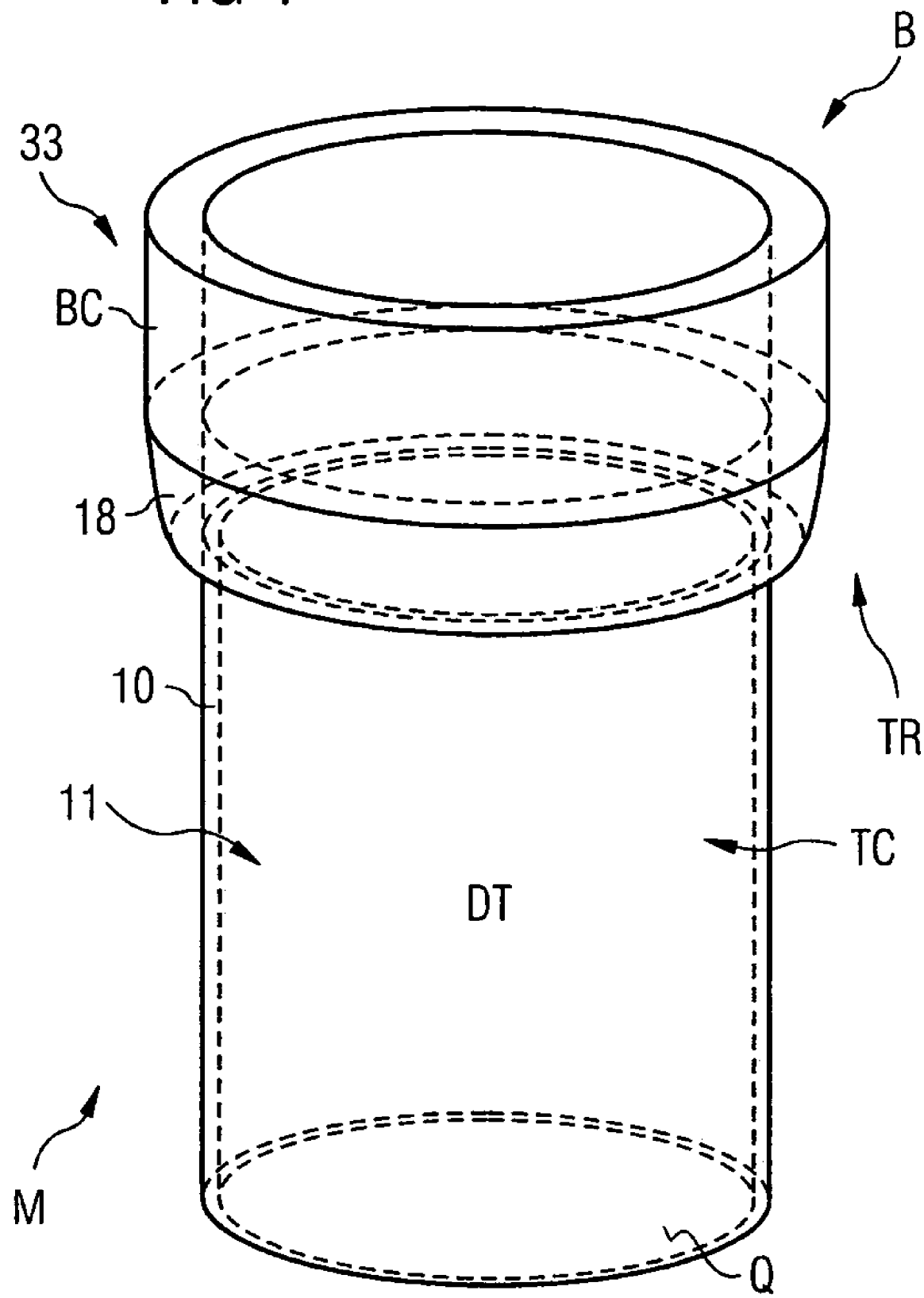
FIG. 1 diagrammatically shows a memory cell with a vertical selection transistor.

FIG. 1 diagrammatically shows the structure of a memory cell M according to the invention. To illustrate the structure, a trench hole DT with a round cross sectional area Q is shown in a perspective view. In the lower part of the trench hole DT, a trench capacitor TC is formed, the outer electrode 9 of which is preferably formed by a diffusion region (not shown here) and the inner electrode 11 of which is formed by an inner filling of the trench hole DT. The outer and the inner electrode 11, 9 of the trench capacitor TC are electrically insulated from one another by a dielectric layer 10. This layer 10 is preferably formed as an oxide layer along the cylindrical side wall of the trench hole DT and at the bottom of the trench hole DT. As shown in FIG. 1, the storage dielectric 10 extends from the trench hole bottom to about ⅔ of the trench hole height. Due to the highly diagrammatic representation of FIG. 1, the relations and distances shown therein are not reproduced true to the original.

To charge and discharge the trench capacitor TC, the memory cell M has a vertical selection transistor TR which is formed in an upper area of the trench hole DT. According to the invention, this selection transistor TR is formed as a structure B completely enclosing the trench hole DT in its upper area in FIG. 1. This structure according to the invention permits a maximum width of the conductive channel which can be formed in the channel area BC due to the interaction with the surrounding word line WL. Since the charge which can be maximally transported per unit of time into or out of the trench capacitor TC via the channel area BC depends directly on the cross sectional area of the conductive channel and thus on the width of the channel area BC, the concept according to the invention also maximizes the saturation current of the channel area BC. Due to the high saturation current, the memory cell M according to the invention can be written to and mad out particularly rapidly in comparison with conventional memory cells with vertical selection transistors. The concept according to the invention is therefore particularly suitable for applications in which shorter access times are necessary.

The selection transistor TR according to the invention consists of two drain-source electrodes 18, 33 which are formed as two diffusion regions in the semiconductor substrate, and a vertical channel area BC which connects the two diffusion regions 18, 33 to one another. The two diffusion regions 18, 33 and the channel area BC are preferably formed annularly along the circumference of the trench hole DT in FIG. 1. The control electrode used is an area of the word line WL directly surrounding the channel area BC (not shown here), the electrical potential of which directly influences the charge carrier concentration in the channel area BC.

The upper drain-source electrode 33 is in contact with a bit line BL (also not shown here) associated with the memory cell M. The lower drain-source electrode 18 is formed as a so-called "buried strap" and joins the channel area BC to the inner electrode 11 of the trench capacitor TC.

To insulate the channel area BC electrically with respect to the word line WL, a thin oxide layer GOX, the so-called gate oxide (not shown here) is formed along the entire outer surface of the channel area BC. Varying the composition and thickness of this layer GOX makes it possible to achieve an optimum interaction between the channel area BC and the word line WL surrounding the channel area BC.

Figure 2A:
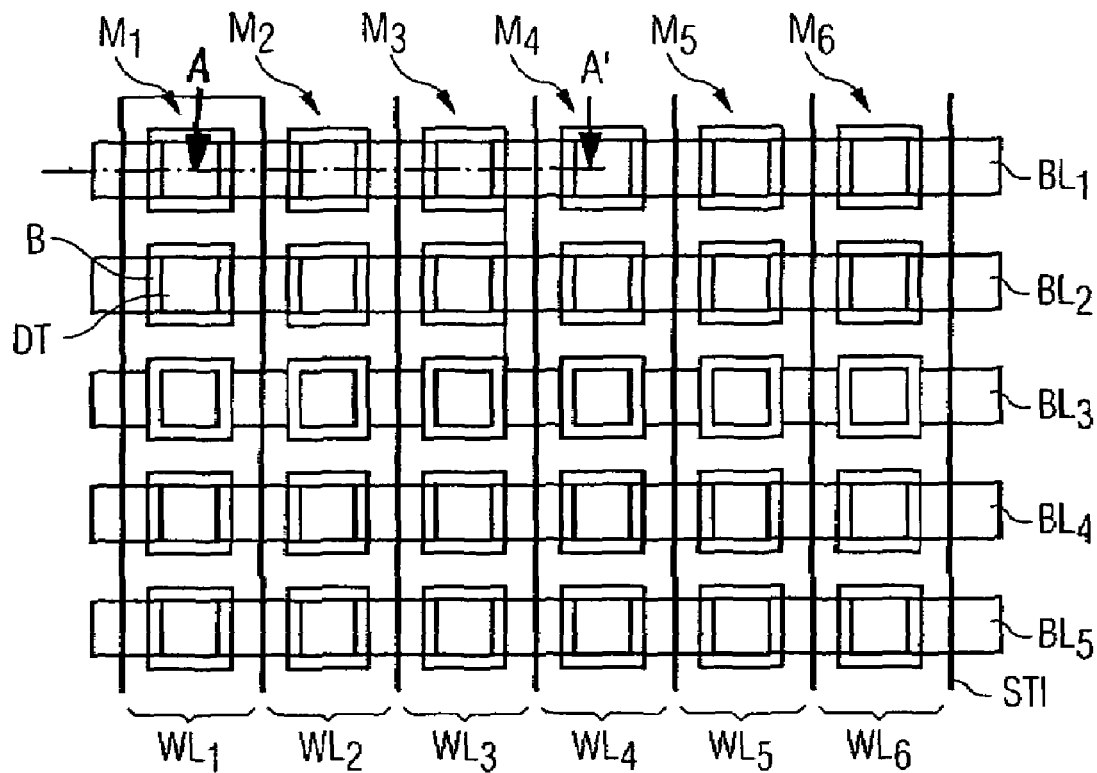
FIGS. 2A and 2B show a first variant of the layout of the invention with square trench holes.
Figure 2B:
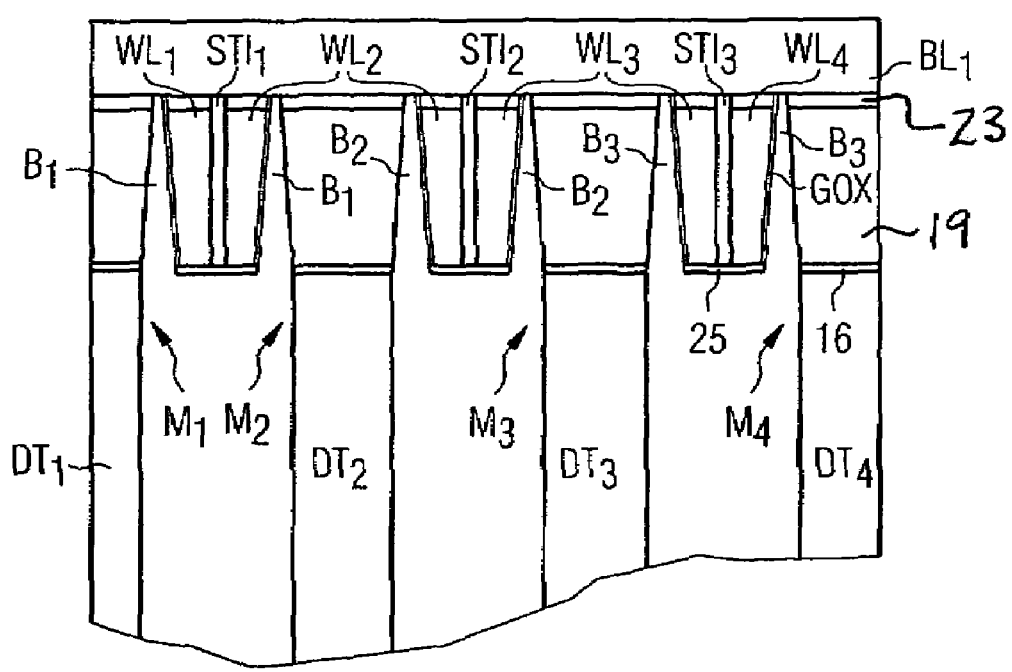

FIGS. 2A and 2B show a first variant of the layout of an arrangement according to the invention of memory cells M in a top view. The memory cells M are arranged in the form of a rectangular matrix in rows and columns. In the example shown here, the trench holes DT have square cross sectional areas Q. The dimension of the trench holes DT is approx. 1 F in the bit line and word line directions, F designating the minimum resolution width of the lithography used. This results in a cross sectional area Q of approx. 1 $F^2$ for each of the trench holes DT. Due to the advantageous arrangement according to the invention, the space required by an individual memory cell M is very little and is approximately 4 $F^2$.

According to the invention, however, trench holes DT having a rectangular cross sectional area Q can also be provided in which the extension differs in the direction of the word line and bit line. Using this variant, a relatively large circumference of the rectangular trench holes DT can be implemented since, given the same cross sectional area Q of a rectangular trench hole DT, the greater the difference between the width and the length, the greater the circumference. Since, in principle, the effective area of the trench capacitors TC is also increased with the circumference of the trench holes DT, a large ratio of width to length results in a relatively high trench capacity referred to the cell area.

Compared with a square trench hole DT of the exemplary embodiment shown, a greater etching depth can be implemented with a rectangular trench hole DT. Even if the dimension of the memory cell M is further decreased, a sufficiently high storage capacity of the trench holes DT can be guaranteed due to the fact that the trench holes DT are etched to a corresponding depth.

In the first layout variant shown in FIG. 2A, semiconductor blocks B which are used as channel areas BC of corresponding selection transistors TS of the memory cells M are in each case formed along the circumference of a trench hole DT. The semiconductor blocks B extend over the entire circumference of the respective trench hole DT and lead through the corresponding word lines WL to the corresponding bit lines BL. Each semiconductor block B is preferably surrounded all around by the associated word line WL. Between a semiconductor block B and the surrounding word line WL, a gate oxide layer (not shown here) is arranged which encloses the semiconductor block B and insulates it with respect to the associated word line WL. Within each channel area BC, a conductive channel 35 forms in dependence on the potential of the word line WL surrounding this channel area BC. The word line WL and, in particular, the area of the word line WL surrounding the semiconductor block B, provides the gate potential for the channel 35 which can be formed within the corresponding semiconductor block B. As such, this can be called a vertical selection transistor TR with circumferentially arranged gate electrode or, respectively, a "surrounded-gate transistor".

Within the layer of the buried word lines WL, isolating trenches STI are formed which insulate directly adjacent word lines WL from one another. The isolating trenches STI extend preferably in the center between two memory cell columns so that each memory cell M is essentially arranged centrally with respect to the respective word line WL. In this arrangement, however, further variants are also possible in which, e.g., the memory cells M are arranged at an edge of the respective word line WL and are enclosed only partially by the associated word line WL.

The conductivity of the word lines WL is directly associated with their width. To guarantee a sufficiently high conductivity of the word lines WL with a correspondingly narrow arrangement of the memory cell columns, the isolating trenches STI for word line separation are preferably generated with the aid of so-called spacer techniques. This makes it possible to implement isolating trench widths which are less than the minimum resolution width F of the production process used. Due to this narrowing of the isolating trenches STI, greater widths are obtained for the word lines WL without increasing the overall space required by the memory cells M. This makes it possible to advantageously reduce the ohmic resistance of the word lines WL which ultimately leads to a better performance of the memory cells M. As a rule, a lower word line resistance also results in lower access time to the selected memory cell M with respect to write or read accesses.

The semiconductor blocks B of the memory cells M are directly contacted by the bit lines BL at the substrate surface. The channel areas BC of the selection transistors TR are activated via the corresponding word lines WL whilst the reading of information out of the memory cell M and the writing of information into the memory cell M takes place via the corresponding bit line BL. Since the semiconductor blocks B are contacted by the respective associated bit line BL above the top edge of the word line, no space needs to be left for separate bit line contact patterns between the word lines WL. The bit line contact is established here directly via the channel areas BC of the vertical selection transistors TR. As such, almost the entire area available at the word line level can be used for the word lines WL which, therefore, can have a greater width and thus a lower path resistance. Using the "surrounded-gate transistors" according to the invention, which are activated by buried word lines WL, the contradictory requirements for wide word lines WL, on the one hand, and for a low space requirement of the memory cells M, on the other hand, can be advantageously combined with one another.

As a rule, conventional bit line contact arrangements which extend through the word line as bit line contacts, are extremely critical with respect to the yield due to various production problems such as, e.g., contact problems between bit line contacts and bit lines or unwanted short circuits between bit line contacts and adjacent word lines. They are, therefore, considered to be "yield detractors" of the respective production process. Since a separate bit line contact arrangement extending through the word line plane is dispersed with in the concept according to the invention, the above mentioned problems during the production process are avoided.

In the first variant of the layout shown in FIG. 2A, the trench holes DT are arranged in a regular arrangement of rows and columns. In such an arrangement of the memory cells M, small inaccuracies in the mask alignment and slight process tolerances are relatively unimportant. Since the distance of a memory cell M from its adjacent cells is essentially equally large, the trench capacity can be increased, if necessary, by so-called "bottling", that is to say by wet-chemical post-etching. As a result, a sufficiently great trench capacity guaranteeing reliable data storage can be provided even with small cell dimensions.

The semiconductor blocks B of the cell array shown in FIG. 2A have an extent of approx. 1.5 F both in the bit line direction and in the word line direction. These semiconductor blocks B, therefore, result in a relatively large width. Because of this large width and the associated channel width, the semiconductor blocks B used as channel areas BC of the selection transistors TR have a high so-called current yield. In consequence, a particularly short access time is obtained for the write or read access to the memory cells M, as a result of which the memory cells M can be written to particularly rapidly and read out rapidly via the bit lines BL. This concept, therefore, is particularly suitable for applications in which a high speed during the write or read access is of importance.

FIG. 2B shows a section through the memory cell arrangement shown in FIG. 2A along line A-A'. Line A-A' extends along the bit line $BL_1$ and comprises a total of four memory cells $M_1$-$M_4$. Each of the memory cells $M_1$-$M_4$ shown diagrammatically in FIG. 2B has a semiconductor block $B_1$-$B_4$ which is formed along the circumference of the respective trench hole $DT_1$-$DT_4$ and extends through the respective buried word line $WL_1$-$WL_4$ to the bit line $BL_1$ formed above the word line plane. The trench capacitor TC arranged in the lower area of the respective trench hole $DT_1$-$DT_4$ can be contacted via the semiconductor block $B_1$-$B_4$. Between the semiconductor block $B_1$-$B_4$ and the word line $WL_1$-$WL_4$ enclosing this semiconductor block $B_1$-$B_4$, a gate oxide layer GOX is arranged which isolates the word line $WL_1$-$WL_4$ surrounding the channel area BC and used as gate electrode from the channel area BC arranged within the semiconductor block $B_1$-$B_4$. Between the individual word lines $WL_1$-$WL_4$ and the bit line $BL_1$, a thin insulator layer 23 is in each case arranged in order to insulate the word lines $WL_1$-$WL_4$ from the bit line $BL_1$. The word lines $WL_1$-$WL_4$ are insulated from the substrate and trench holes $DT_1$-$DT_4$ located underneath by means of a covering oxide layer 25.

The upper area of each trench hole $DT_1$-$DT_4$ which represents the inner area of the corresponding hollow semiconductor block $B_1$-$B_4$ is filled with a particular material 19. In this arrangement, the characteristics of the corresponding channel area BC are determined, in particular, by the electrical characteristics of this filling material 19 (work function). Thus, the behavior and characteristics of the respective selection transistor TR can be influenced selectively by selecting the filling material 19 and the structure for the filling material 19 (i.e., the cuboid filling block in this case). An additional insulator layer 23 may be necessary between filling material 19 and bit line $BL_1$, in particular in the case of conductive filling materials 19.

To be able to reliably activate the conductive channel 35 within each of the semiconductor blocks $B_1$-$B_4$, the corresponding word line $WL_1$-$WL_4$ must be made wider than the outer diameter of the respective semiconductor block $B_1$-$B_4$ and, therefore, also wider than the diameter of the trench holes $DT_1$-$DT_4$. As shown in FIG. 2B, the buried word lines $WL_1$-$WL_4$ in each case extend to the right and to the left of the corresponding semiconductor blocks $B_1$-$B_4$. They are insulated from the adjacent word lines $WL_1$-$WL_4$ by means of the isolating trenches $STI_1$-$STI_3$. The covering oxide layer 25 is used for electrically isolating the word lines $WL_1$-$WL_4$ from the trench holes $DT_1DT_4$ arranged underneath.

Figure 3A:
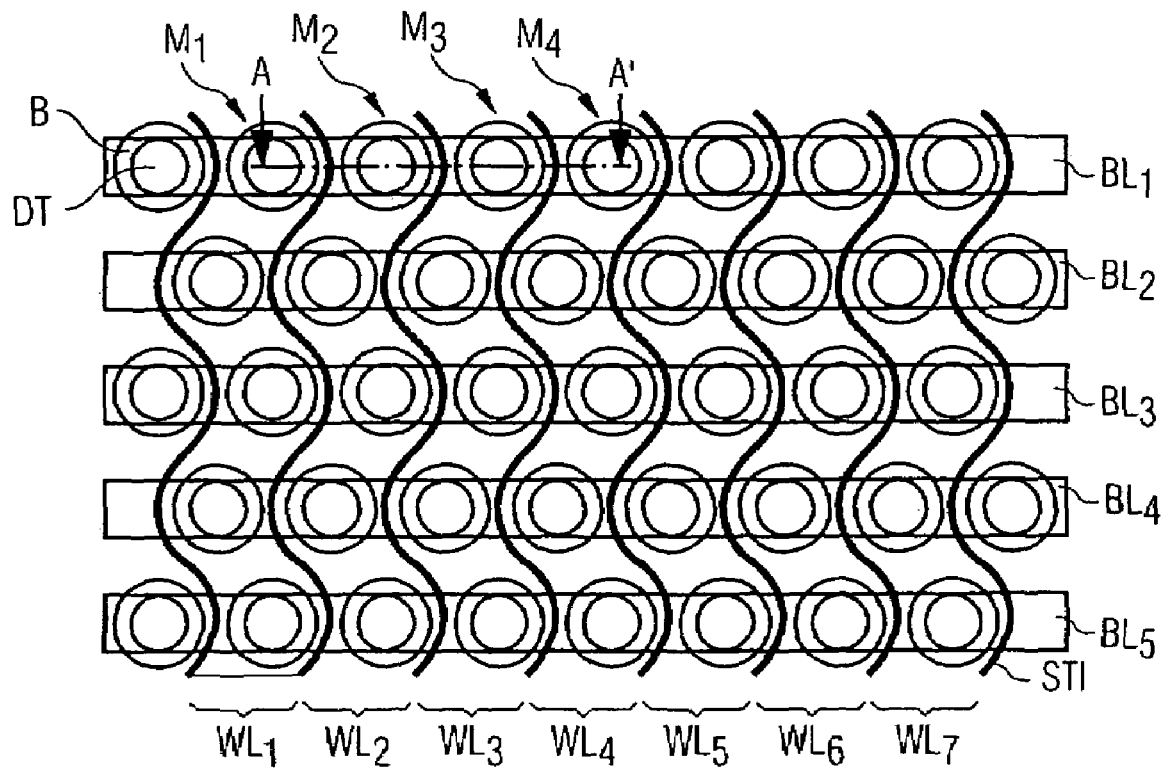
FIGS. 3A and 3B show a second variant of the layout of the invention with circular trench holes.
Figure 3B:
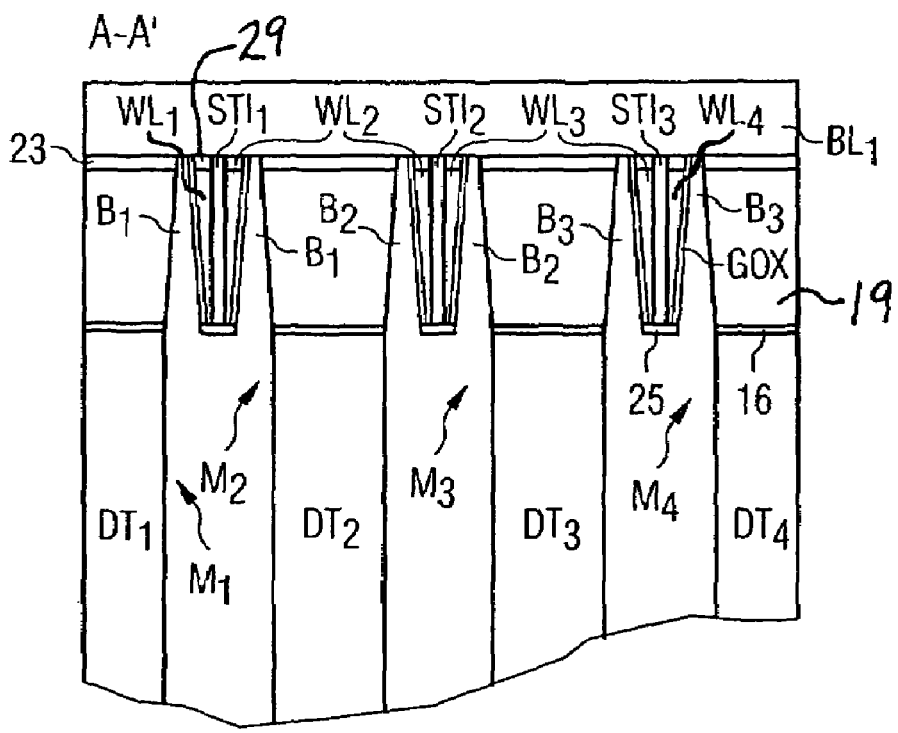

FIGS. 3A and 3B show by way of example a second variant of the layout of an arrangement according to the invention of 40 memory cells M, in which the rows of the trench holes DT, which are oriented in the direction of the bit line, are arranged offset with respect to one another. In this arrangement, the trench holes DT have a circular cross sectional area Q with a diameter of approx. 1 F. The semiconductor blocks B forming the channel areas BC of the respective selection transistors TR are formed annularly along the entire circumference of the corresponding trench holes DT, according to the invention, and have an outer diameter of approx. 1.5 F. The mutually offset arrangement of the memory cells M, where the memory cells M of a row are in each case arranged centrally in the direction of the word line between two memory cells M of an immediately adjacent row, permits a high packing density and thus a low space requirement per memory cell M. As in the first variant of the layout, this is also approx. 4 $F^2$.

To be able to utilize the entire width of a channel area BC for forming a conductive channel 35, the entire channel area BC of each memory cell M is preferably surrounded by an associated word line WL. Due to the mutually offset memory cell rows, the word lines WL can, therefore, not extend in a straight line in the exemplary embodiment of FIG. 3A. This is implemented, e.g., by serpentine or zigzag-shaped isolating trenches STI which extend between the offset memory cells M of directly adjacent memory cell rows and separate the adjacent word lines WL from one another. The isolating trenches STI advantageously extend in each case exactly in the center between two adjacent memory cells M of a row without touching the channel areas BC of the memory cells M. This ensures that the channel areas BC are completely enclosed by the respective word lines WL and thus the entire semiconductor block B of each memory cell M can be used as a channel area BC for forming a conductive channel 35. This conductive channel 35 is formed in dependence on the potential of the respective associated word line WL within the corresponding channel area BC so that a conductive connection is established between the electrodes 18, 33 of the respective selection transistor TR and the corresponding bit line BL.

FIG. 3B shows a section through the memory cell arrangement according to the second variant of the layout in FIG. 3A along line A-A'. The section comprises four memory cells $M_1$-$M_4$ which are arranged along a common bit line $BL_1$ analogously to FIG. 2B. Each of the memory cells $M_1$-$M_4$ in each case has a semiconductor block $B_1$-$B_4$ which is formed along the circumference of the corresponding trench hole $DT_1$-$DT_4$ and is in contact with the common bit line $BL_1$. Each semiconductor block $B_1$-$B_4$ is enclosed on both sides by its own associated word line $WL_1$-$WL_4$, a gate oxide layer GOX being formed in each case between the respective semiconductor block $B_1$-$B_4$ and the corresponding word line $WL_1$-$WL_4$. Adjacent word lines $WL_1$-$WL_4$ are separated from one another by isolating trenches $STI_1$-$STI_3$. The word lines $WL_1$-$WL_4$ are insulated from the trench holes $DT_1$-$DT_4$ located underneath by means of the covering oxide layer 25 and in each case have a thin insulator layer 29 which insulates the word lines $WL_1$-$WL_4$ with respect to the bit line $BL_1$.

The upper area of each french hole $DT_1$-$DT_4$ which represents the inner area of the corresponding hollow semiconductor block $B_1$-$B_4$ is filled with a particular material 19. In this arrangement, the characteristics of the corresponding channel area BC are determined, in particular, by the electrical characteristics of this filling material 19 (work function). Thus, the behavior and the characteristics of the respective selection transistor TR can be selectively influenced by selecting the filling material 19 and structure for the filling material 19 (i.e., the cylindrical filling block in this case). An additional insulating layer 23 may be necessary between filling material 19 and the bit line $BL_1$ arranged above it, particularly in the case of conductive filling materials 19.

Crosstalk between the buried-strap areas 18 of different memory cells M can be prevented by an insulating trench pattern arranged below the level of the word lines WL both in the first and in the second variant of the layout. For this purpose, insulating trenches can be arranged in horizontal and/or in vertical direction between the buried-strap areas 18 (not shown here). Widening the word line isolation trenches STI into the semiconductor substrate 1 in order to insulate the buried-strap areas 18 from one another in the direction of the bit line of adjacent memory cells M is also conceivable.

Due to the regular arrangement of the two variants of the layout shown here, the extension of the trench holes DT in the direction of the bit line and the word line can be varied to a greater extent. As such, both the memory capacity and the current yield of the channel areas BC can be adjusted within wide ranges.

In the text which follows, a production method according to the invention is explained by way of example with reference to drawings.

Figure 4A:
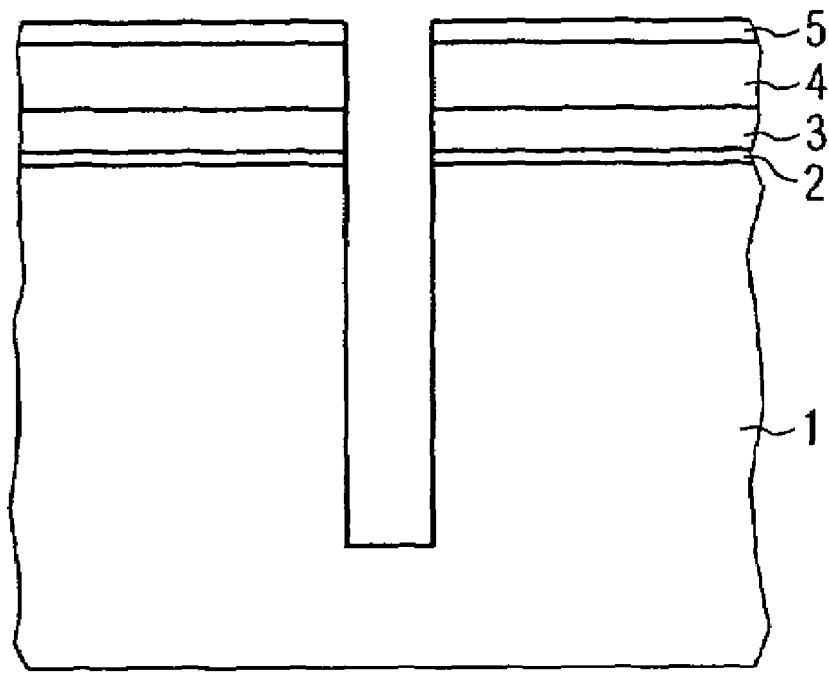
FIGS. 4A to 4L show individual method steps of the method according to the invention.

A lightly p-doped silicon wafer is used as the starting point for the production of an arrangement of memory cells M according to the invention. In a first step, the trench holes DT must be etched out of the silicon. As shown in FIG. 4A, an etching mask is applied to a silicon substrate 1 for this purpose. The etching mask preferably consists of a thermal oxide layer 2, a nitride layer 3 and a further oxide layer 4, preferably of borosilicate glass, deposited by means of chemical vapor deposition (CVD). Whereas the thermal oxide layer 2 only has a thickness of about 5 nm, the nitride layer 3 has a thickness of preferably 200 nm. The thickness of the oxide layer 4 is preferably approx. 1000 nm.

A photoresist layer 5 is applied to this etching mask, exposed by means of a lithographic etching method and then etched. During this process, areas which essentially correspond to the cross sectional area Q of a trench hole DT are etched out of the photoresist 5. Following this, both the layers 2, 3, 4 and the silicon substrate 1 are etched to a predetermined depth in order to create trench holes DT in this manner. This state of the method is shown in FIG. 4A.

Figure 4B:
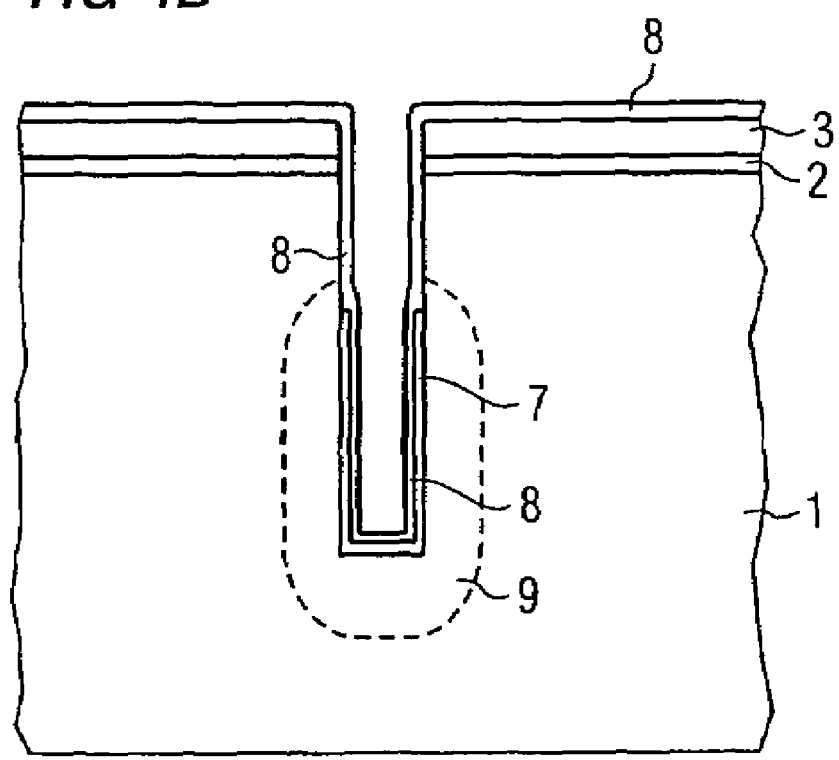

Both the photoresist layer 5 and the oxide layer 4 are removed again. After that, the counterelectrode 11 (buried plate) of the trench capacitor TC is now to be formed. For this purpose, an arsenic-doped oxide layer 7 is deposited by means of CVD (chemical vapor deposition). This arsenic-doped oxide layer 7 is then etched back to a first depth in a first recess step. Following this, a further oxide layer 8 is applied by means of CVD. In a subsequent outdiffusion process, an n-doped zone 9 is created around the lower trench area in the vicinity of the arsenic-doped oxide layer 7 in the p-doped silicon substrate 1. The n-doped zone 9 is also called a "buried plate" and is used as counterelectrode of the trench capacitor. This state of the method is shown in FIG. 4B.

Figure 4C:
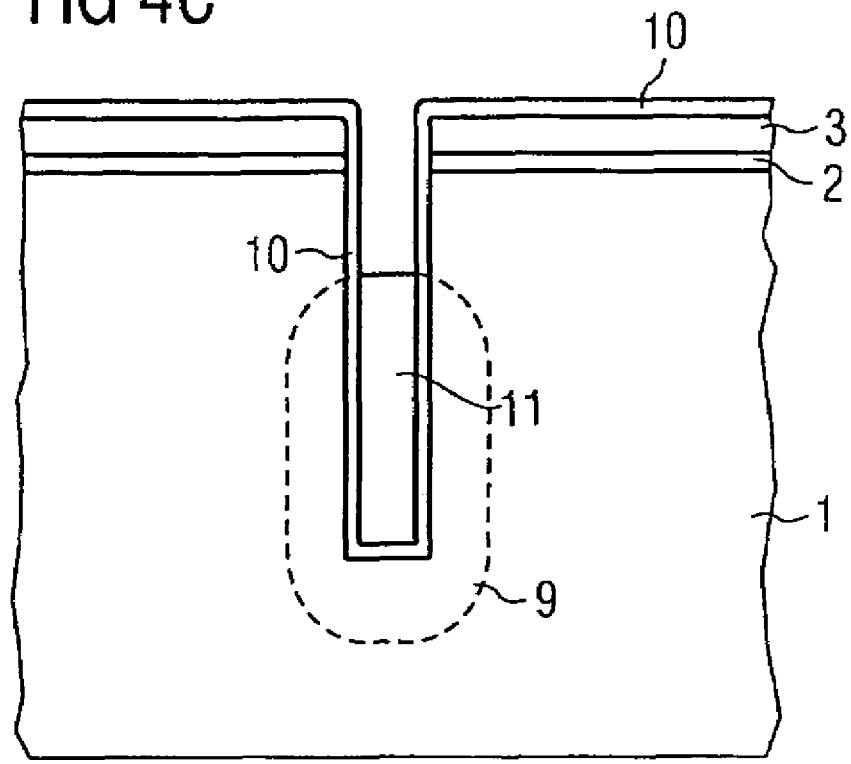

After the oxide layer 8 and the arsenic-doped oxide layer 7 have been removed, a dielectric layer 10 is applied to the inside of the trench hole DT. The dielectric layer 10 is preferably a nitride oxide layer with a thickness of about 5 nm. The dielectric layer 10 will be used later as dielectric of the storage capacitor TC. The lower area of the trench hole DT is filled with a first polysilicon 11. For this purpose, the entire trench hole DT is first filled up with n-doped polysilicon 11 and then the polysilicon 11 is etched back again to the first depth. This state of the method is shown in FIG. 4C.

The dielectric layer 10, can then be removed from the side walls of the trench hole DT in the upper area of the trench hole DT, that is to say in the area above the first polysilicon 11. Next, a so-called collar oxide 12 is deposited by means of CVD on the side wall of the trench hole DT in the area above the dielectric layer 10. The collar oxide 12 preferably consists of silicon oxide. After the deposition, the collar oxide 12 is anisotropically etched back. The collar oxide 12, which is also called "thick oxide", is mainly used for preventing parasitic currents between the n-doped zone 9 and the selection transistor TR of the memory cell M, described below.

Figure 4D:
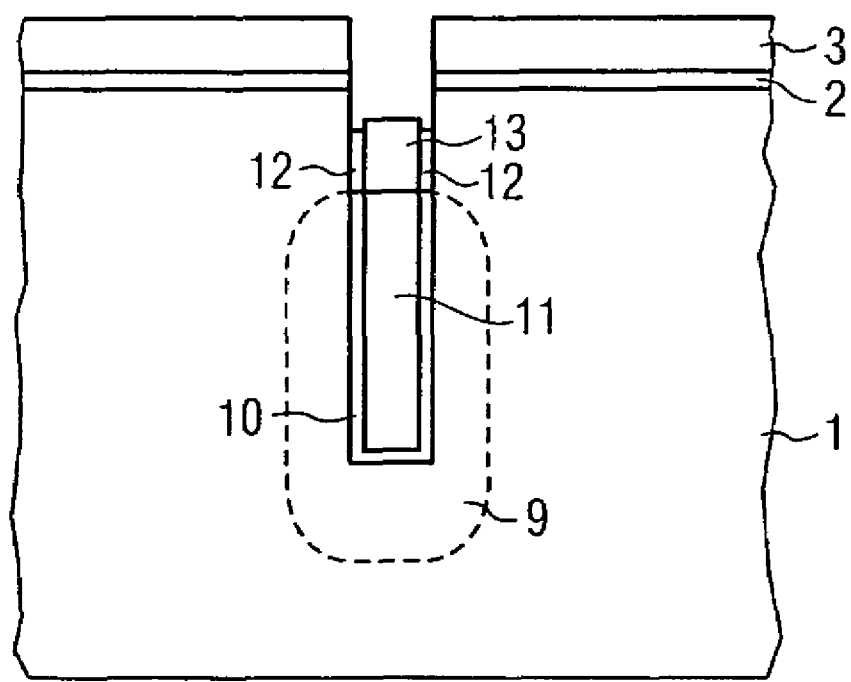

Next, a second polysilicon 13 is deposited into the trench hole DT and then etched back to a second level below the silicon surface in a second recess step. The collar oxide 12 is then removed to below the upper edge of the second polysilicon 13. This state of the method is shown in FIG. 4D.

Figure 4E:
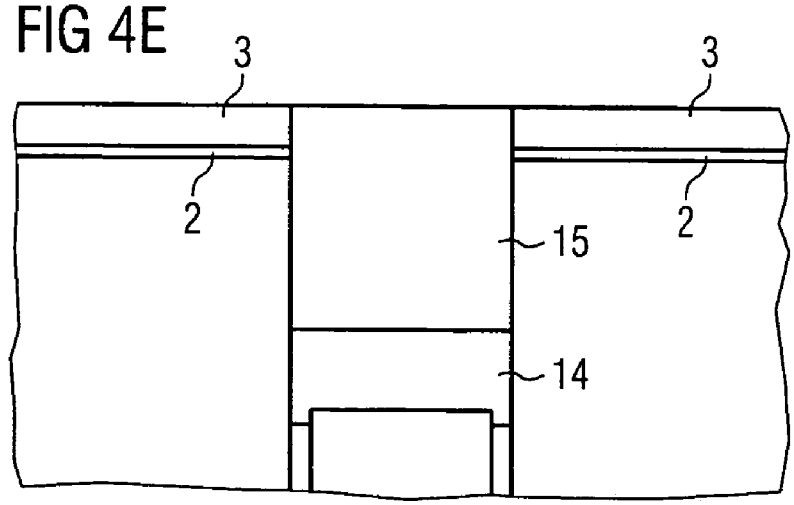

In a further method step, an n-doped third polysilicon 14 is deposited into the trench hole DT. In this process, arsenic-doped polysilicon is preferably used. In the subsequent third recess step, the third polysilicon 14 is etched back to a third depth. The trench hole DT is filled with a first filling material 15. This state of the method is shown in FIG. 4E.

Figure 4F:
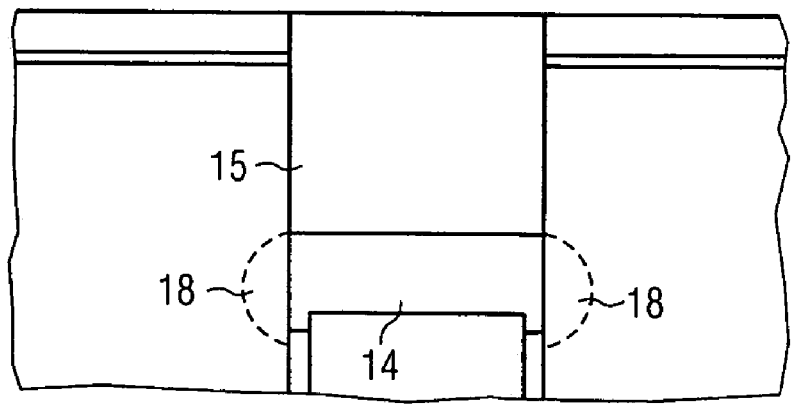

In a further method step, a diffusion region 18, the so-called buried-strap area, is created in the semiconductor substrate 1 which later forms the lower source-drain electrode of the vertical selection transistor TR and joins the outer electrode 9 of the trench capacitor TC to a channel area BC. For this purpose, the buried-strap area 18 is created by outdiffusion out of the n-doped third polysilicon 14 in a thermal outdiffusion process. This state of the method is shown in FIG. 4F. However, this thermal outdiffusion process can also be carried out at a later time. The buried-strap area 18 thus created extends along the circumference of the trench hole DT and preferably completely surrounds the trench hole DT.

The first filling material 15 above the third polysilicon 14 is then etched back to a third depth, that is to say to the upper edge of the third polysilicon 14, in a fourth recess step. During this process, the first filling material 15 is removed completely. In this fourth recess step, the third polysilicon 14 can be used as etching stop.

Figure 4G:
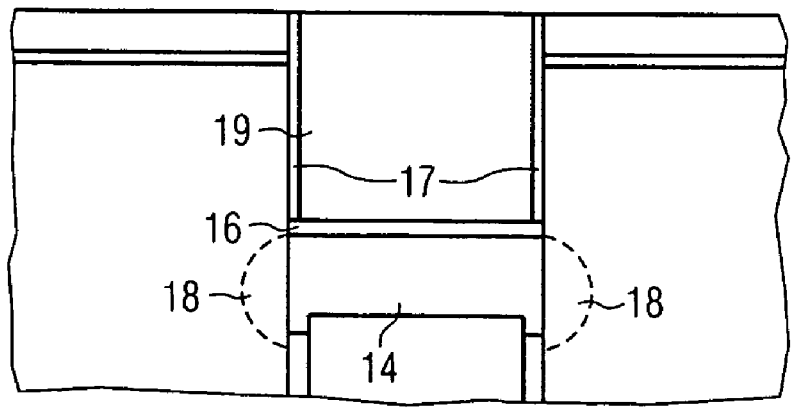

Following this, an insulator layer 16 is created in the exposed trench hole DT and the upper area of the trench hole DT is filled with a second filling material 19. This second filling material 19 forms the filling of the trench hole DT in the area of the channel area BC created later. Since the filling material 19 is arranged in the interior of the semiconductor block B, its physical and electrical characteristics also influence the characteristics of the channel area BC surrounding the filling material 19. By suitable selection of the filling material 19 and the cylindrical filling block 19 formed from it, the behavior and the characteristics of the later selection transistor TR can, therefore, be influenced selectively. To insulate the filling material 19 from the channel area BC, a thin insulator layer 17 can be created on the side walls of the trench hole DT before the deposition of the filling material 19. This state of the method is shown in FIG. 4G. The generation of the insulator layers 16 and 17, respectively, can also be omitted if the second filling material 19 is itself an insulator.

Figure 4H:
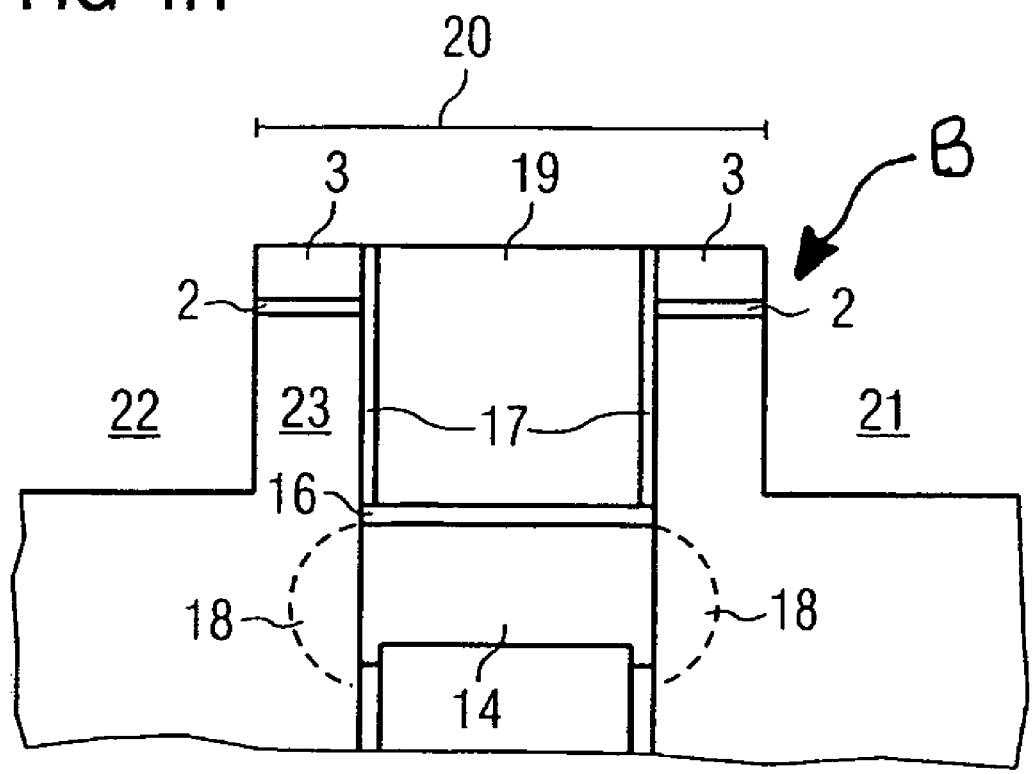

Next, recesses are patterned for receiving the buried word lines WL. For this purpose, the silicon substrate 1 is selectively etched at locations 21 and 22 with the aid of a further photoresist mask 20, the second filling material 19 being left in this first etching step. A semiconductor block B surrounding the trench hole DT is also left in this first etching step. The semiconductor block B will be used later as a channel area of the selection transistor, a conductive channel 35 being able to form in the interior of the semiconductor block B in dependence on the potential of the associated word line WL. The state of the method after the first etching step is shown in FIG. 4H.

After this etching step, the recesses 24 for the word lines WL have been completely etched away.

Figure 4I:
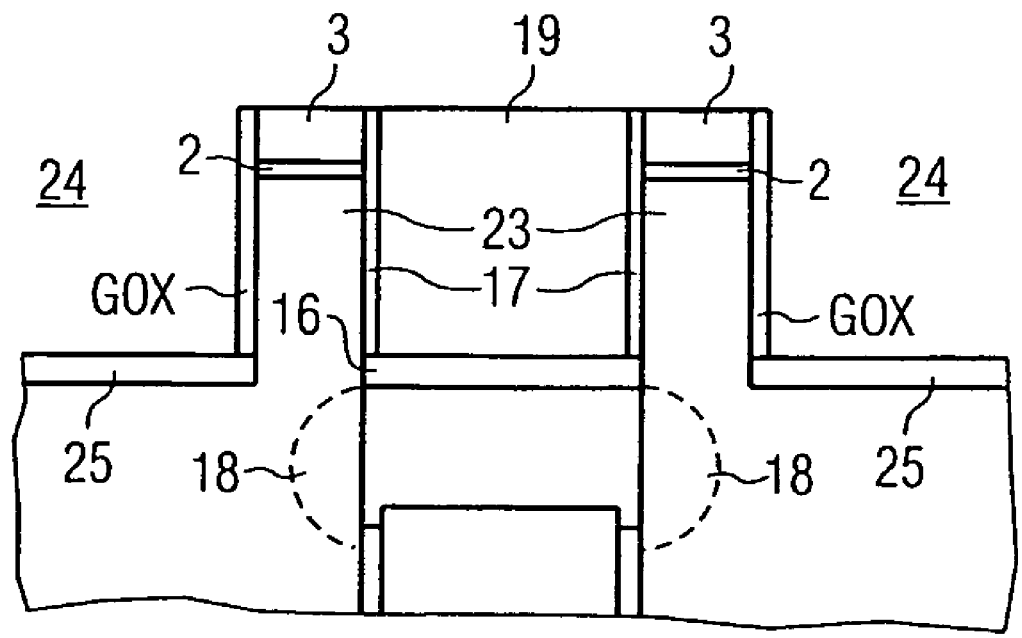

Following this, a covering oxide layer 25, which has the task of insulating the later word line WL with respect to the semiconductor substrate 1, is introduced into the recesses 24. To create the covering oxide layer 25, the recesses 24 are first filled with an oxide or with another insulating material by means of a CVD (chemical vapor deposition) method. After that, this insulating material is etched back until only the covering oxide layer 25 is present in the desired thickness. A gate oxide GOX is applied to the side walls of the recesses 24 in a thermal process. The gate oxide GOX is a thin, thermally created oxide. The corresponding state of the method is shown in FIG. 4I.

Figure 4J:
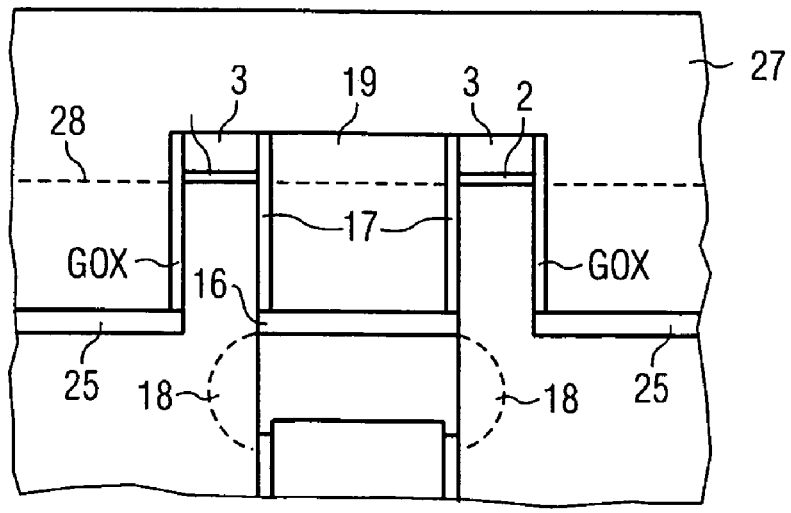
Figure 4K:
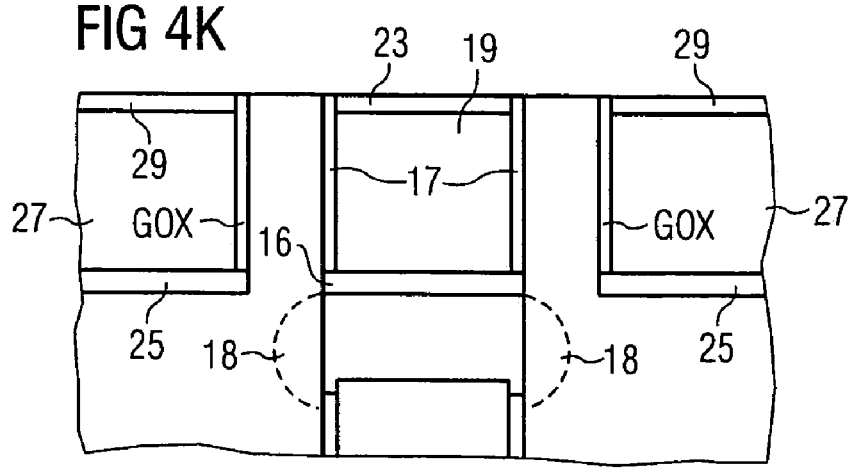
Figure 4L:
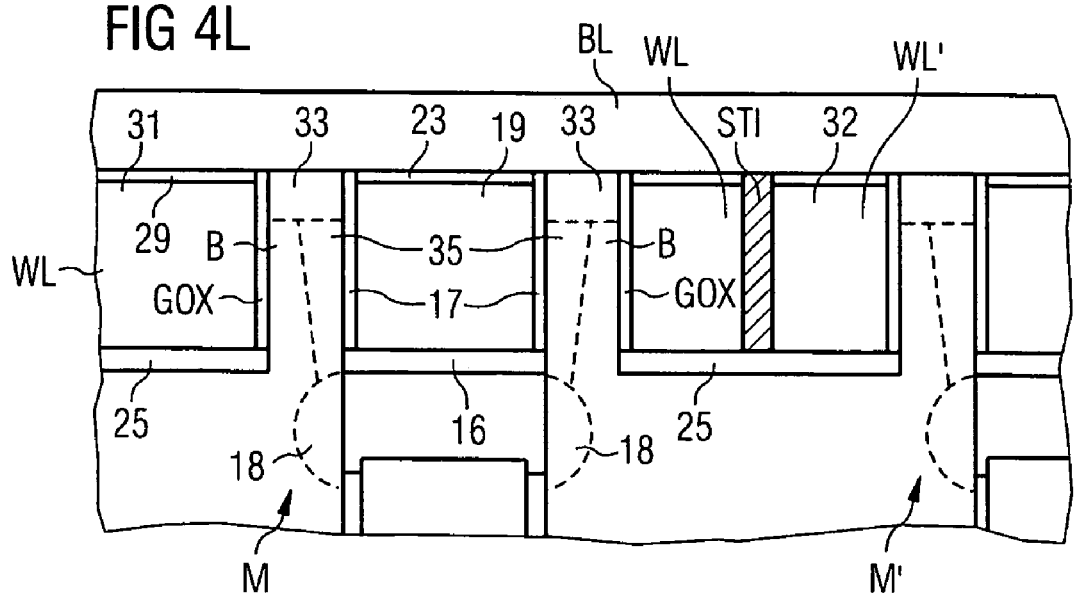

Next, conductive material for the word lines WL must be introduced into the recesses 24. During this process, the semiconductor blocks B are enclosed by the conductive material. In this exemplary variant of the method for patterning the word lines WL, which is shown in FIGS. 4J to 4L, n-doped polysilicon 27 is first deposited on the prepatterned substrate by means of a CVD method. This state of the method is shown in FIG. 4J.

Following this, the substrate is surface-ground by means of a chemical-mechanical polishing method (CMP), in such a manner that the nitride layer 3 applied initially, the thermal oxide layer 2 and the filling layer 19 are also removed. The height to which the substrate is ground away is drawn as line 28 in FIG. 4J.

After the surface-grinding, the polysilicon 27 is etched back to underneath the substrate surface. On the polysilcon 27 etched back, which now forms the word line layer, insulating material 29 is then deposited by means of CVD, preferably oxide or nitride. After the deposition of the insulating material 29, the substrate surface is again surface-ground by means of chemical-mechanical polishing (CMP) in order to pattern an insulating layer 29 by this means. During the etching-back step of the polysilicon 27, the filling material 19 can also be advantageously etched back. If the filling material 19 consists of an electrically conductive material, any insulating layer 23 can also be created on it in order to insulate it from the later bit line BL. This state of method is shown in FIG. 4K.

Next, the individual adjacently arranged word lines WL must be electrically insulated from one another. For this purpose, isolating trenches STI for word line isolation are preferably etched out of the n-doped polysilicon 27 by means of a mask step. The covering oxide layer 25 is preferably used as etching stop during the patterning of the isolating trenches STI. After the etching, the isolating trenches STI are filled up with insulating material, preferably with oxide or nitride. As is shown in FIG. 4L, the word line WL associated with the memory cell M is insulated from a word line WL', associated with an adjacent memory cell M', by means of an isolating trench STI. The isolating trench STI preferably extends exactly in the center between the two memory cells M, M'.

So that the semiconductor block B can be contacted better via the bit line BL located above it, an n-doped area 33 can be created by means of ion implantation in an upper area of the semiconductor block B.

As in previous methods, various metalization levels can now be applied to the substrate prepatterned in this manner. Bit lines BL which are used for contacting the channel areas BC in the semiconductor blocks B are patterned directly on the substrate surface. A bit line BL extends perpendicularly to the word lines WL. This state of the method is shown in FIG. 4L.

In the method for patterning the word lines WL, presented by means of FIGS. 4J to 4L, polysilicon was used as conductive material. As an alternative, a method for patterning the word lines WL can also be described in which, instead of polysilicon, a layer structure consisting of polysilicon, titanium and tungsten is introduced into the recesses 24. As a result, the conductivity of the word lines WL can be increased compared with the polysilicon solution.

The preceding description only describes advantageous exemplary embodiments of the invention. The features disclosed therein and in the claims and the drawings can, therefore, be essential for the realization of the invention in its various embodiments, both individually and in any combination.

What is claimed is:

1. A memory cell, comprising:
   a cylindrical trench capacitor formed in a lower portion of a trench hole, the cylindrical trench capacitor comprising:
      an inner electrode;
      an outer electrode; and
      a dielectric layer disposed between the inner electrode and the outer electrode; and
   a vertical selection transistor located above the cylindrical trench capacitor and comprising a first source-drain area, a second source-drain area and an interposed channel area formed between the first and second source-drain areas; wherein a conductive channel is formed in the channel area according to a potential of a word line to connect the inner electrode of the trench capacitor to a bit line; and wherein the channel area encloses an upper portion of the trench hole and the word line at least partially encloses the channel area.

2. The memory cell of claim 1, wherein the inner electrode comprises a filling in the trench hole and wherein the outer electrode is formed around the trench hole.

3. The memory cell of claim 1, wherein the first source-drain area is connected to the inner electrode of the trench capacitor and the second source-drain area is connected to the bit line.

4. The memory cell of claim 1, wherein the second source-drain area is a diffused portion of a substrate and is connected directly to the bit line.

5. The memory cell of claim 1, wherein the vertical selection transistor is located about the upper portion of the trench hole.

6. The memory cell of claim 1, wherein the bit line extends substantially in the center above the trench hole.

7. The memory cell of claim 1, wherein the first source-drain area is connected as a buried strap area with the inner electrode of the trench capacitor.

8. The memory cell of claim 1, wherein the word line is implemented as a buried word line in a substrate and which extends from a predetermined depth to an upper surface of the substrate.

9. The memory cell of claim 1, wherein the upper portion of the trench hole, which is enclosed by the channel area (BC), is filled with a material which, due to at least one of its physical and electrical characteristics, influences the conductivity of the channel area.

10. The memory cell of claim 1, wherein the bit line and the trench hole have a substantially identical width.

11. The memory cell of claim 1, wherein the trench hole and the channel area have a substantially polygonal cross section.

12. The memory cell of claim 11, wherein the polygonal cross section is one of square and rectangular.

13. The memory cell of claim 1, wherein the word line is defined by two parallel conductive paths having the trench hole formed therebetween.

14. The memory cell of claim 13, wherein the channel area is formed in a portion of a substrate disposed between the two parallel conductive paths.

15. The memory cell of claim 13, further comprising a gate oxide layer disposed between the channel area and each of the two parallel conductive paths of the word line.

16. An array of memory cells, comprising a plurality of memory cells arranged in rows and columns in the form of a matrix; wherein each of the plurality of memory cells comprises:

a cylindrical trench capacitor formed in a lower portion of a trench hole, the cylindrical trench capacitor comprising:

an inner electrode;

an outer electrode; and a dielectric layer disposed between the inner electrode and the outer electrode; and a vertical selection transistor located above the cylindrical trench capacitor and comprising a first source-drain area, a second source-drain area and an interposed channel area formed between the first and second source-drain areas; wherein a conductive channel is formed in the channel area according to a potential of a word line to connect the inner electrode of the trench capacitor to a bit line; and wherein the channel area encloses an upper portion of the trench hole and the word line at least partially encloses the channel area.

17. The array of memory cells of claim 16, wherein the memory cells of each column are arranged on an axis orthogonal to the bit line and are connected to a word line allocated to the column, and wherein two directly adjacent word lines are isolated from one another by an insulation trench extending substantially in the center between memory cells of respective columns.

* * * * *

UNITED STATES PATENT AND TRADEMARK OFFICE
CERTIFICATE OF CORRECTION

PATENT NO. : 7,372,093 B2
APPLICATION NO. : 10/744056
DATED : May 13, 2008
INVENTOR(S) : Sommer et al.

It is certified that error appears in the above-identified patent and that said Letters Patent is hereby corrected as shown below:

Column 4, Line 51, please delete "mad" and insert --read--;

Column 8, Line 25, please delete "Is" and insert --is--;

Column 8, Line 26, please delete "Isolating" and insert --isolating--;

Column 8, Line 61, please delete "french" and insert --trench--;

Column 11, Line 27, please delete "41" and insert --4I--.

Signed and Sealed this

Fifth Day of May, 2009

JOHN DOLL
*Acting Director of the United States Patent and Trademark Office*